United States Patent
Song et al.

(10) Patent No.: US 11,908,982 B2
(45) Date of Patent: Feb. 20, 2024

(54) LIGHT-EMITTING DIODE PACKAGE AND ELECTRONIC DEVICE INCLUDING THE SAME

(71) Applicant: SAMSUNG ELECTRONICS CO., LTD., Suwon-si (KR)

(72) Inventors: Jongsup Song, Hwaseong-si (KR);
Tetsuo Ariyoshi, Seongnam-si (KR);
Taehyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 526 days.

(21) Appl. No.: 17/243,816

(22) Filed: Apr. 29, 2021

(65) Prior Publication Data
US 2022/0109089 A1 Apr. 7, 2022

(30) Foreign Application Priority Data
Oct. 6, 2020 (KR) .................. 10-2020-0128955

(51) Int. Cl.
| | |
|---|---|
| H01L 33/56 | (2010.01) |
| H01L 33/46 | (2010.01) |
| H01L 33/48 | (2010.01) |
| H01L 33/58 | (2010.01) |
| H01L 33/62 | (2010.01) |
| H01L 33/50 | (2010.01) |
| H01L 33/60 | (2010.01) |
| G02B 3/08 | (2006.01) |
| F21V 8/00 | (2006.01) |

(52) U.S. Cl.
CPC .............. *H01L 33/56* (2013.01); *H01L 33/46* (2013.01); *H01L 33/486* (2013.01); *H01L 33/58* (2013.01); *H01L 33/62* (2013.01)

(58) Field of Classification Search
CPC ....... H01L 33/46; H01L 33/60; H01L 33/505; H01L 33/62; H01L 33/486; G02B 6/0031; G02B 6/0026; G02B 6/003; G02B 6/0073; G02B 3/08; F21V 5/045
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

FOREIGN PATENT DOCUMENTS

CN 110707189 A * 1/2020 .............. G02B 3/08

*Primary Examiner* — Antonio B Crite
(74) *Attorney, Agent, or Firm* — Muir Patent Law, PLLC

(57) ABSTRACT

A light-emitting diode (LED) package includes an LED chip on a substrate, an adhesive phosphor film on the LED chip, a cell lens on the adhesive phosphor film, and a lateral reflective layer covering respective lateral surfaces of the LED chip, the adhesive phosphor film, and the cell lens, a lateral surface of the lateral reflective layer being coplanar with a lateral surface of the substrate.

20 Claims, 11 Drawing Sheets

(56) References Cited

U.S. PATENT DOCUMENTS

| | | |
|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,748,921 B2 | 6/2014 | Martin et al. |
| 8,766,295 B2 | 7/2014 | Kim |
| 9,012,950 B2 | 4/2015 | Choi |
| 9,368,702 B2 | 6/2016 | Bierhuizen |
| 10,009,527 B2 | 6/2018 | Jagt et al. |
| 10,352,530 B2 | 7/2019 | Kang |
| 10,622,526 B2 | 4/2020 | Wang |
| 2016/0005931 A1* | 1/2016 | Lee ................ H01L 33/486 257/98 |

* cited by examiner

US 11,908,982 B2

LIGHT-EMITTING DIODE PACKAGE AND ELECTRONIC DEVICE INCLUDING THE SAME

CROSS-REFERENCE TO RELATED APPLICATION

Korean Patent Application No. 10-2020-0128955, filed on Oct. 6, 2020 in the Korean Intellectual Property Office, and entitled: "Light-Emitting Diode Package and Electronic Device Including the Same," is incorporated by reference herein in its entirety.

BACKGROUND

1. Field

Embodiments relates to a light-emitting diode (LED) package and an electronic device including the same.

2. Description of the Related Art

An LED chip and an LED package including the LED chip have various advantages, e.g., low power consumption, high brightness, and a long lifetime. Thus, the application field of the LED chip and the LED package as a light source is gradually expanding. For example, the LED package may be used as an illuminating light source in a flash light of a camera module in a handset product, e.g., a smartphone.

SUMMARY

According to embodiments, there is provided a light-emitting diode (LED) package. The LED package includes an LED chip arranged on a substrate, an adhesive phosphor film arranged on the LED chip, a cell lens arranged on the adhesive phosphor film, and a lateral reflective layer covering respective lateral surfaces of the LED chip, the adhesive phosphor film, and the cell lens, wherein a lateral surface of the lateral reflective layer is coplanar with a lateral surface of the substrate.

According to embodiments, there is provided an LED package. The LED package includes an LED chip configured to be electrically connected to a substrate, an adhesive phosphor film contacting an upper surface of the LED chip, a cell lens partially contacting an upper surface of the adhesive phosphor film, and a lateral reflective layer covering respective lateral surfaces of the LED chip, the adhesive phosphor film, and the cell lens, wherein the cell lens includes a Fresnel lens, and an air gap is formed between the cell lens and the adhesive phosphor film.

According to embodiments, there is provided an electronic device including a cover glass in which an optical window is formed, and an LED package configured to emit light through the optical window. The LED package includes an LED chip configured to be electrically connected to a substrate; an adhesive phosphor film contacting an upper surface of the LED chip, a cell lens partially contacting an upper surface of the adhesive phosphor film, and a lateral reflective layer covering respective lateral surfaces of the LED chip, the adhesive phosphor film, and the cell lens, wherein an air gap is formed between the cell lens and the adhesive phosphor film, and the cell lens further includes a vent hole communicating with the air gap and formed in a center of the cell lens, and a diameter of the air gap is in a range of 0.5 mm to 1.4 mm, and a diameter of the vent hole is in a range of 50 μm to 100 μm.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
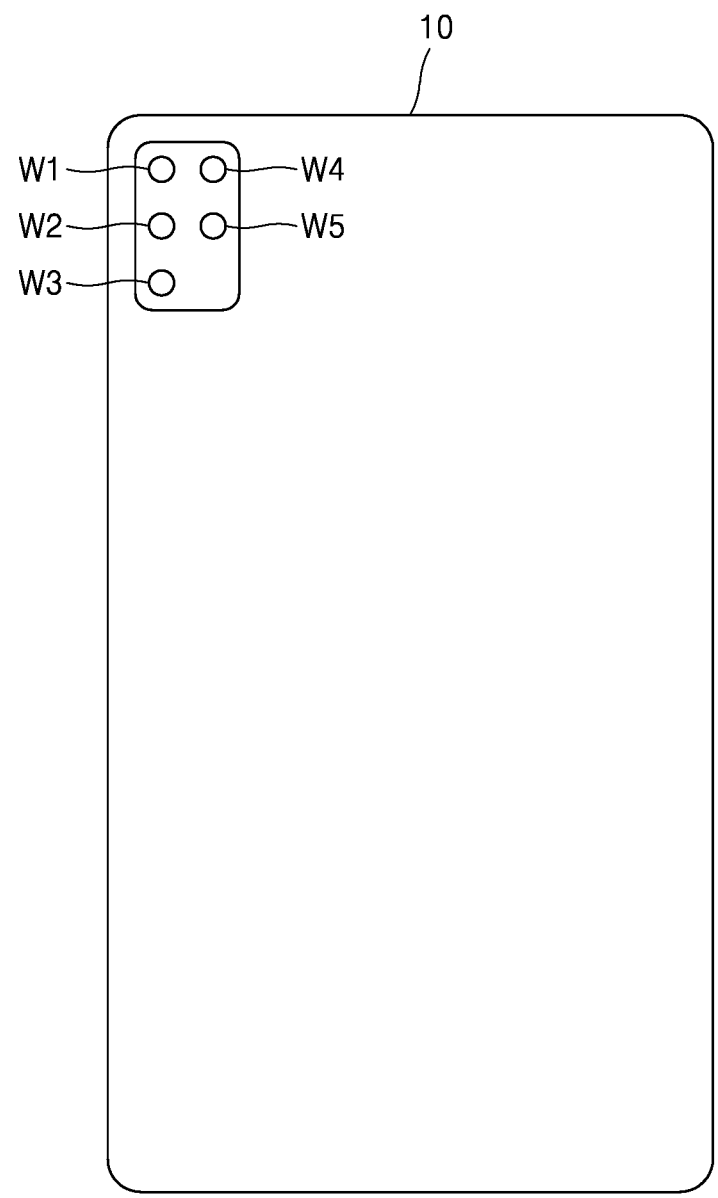
FIG. 1A is a plan view of an electronic device including a light-emitting diode (LED) package according to exemplary embodiments.
Figure 1B:
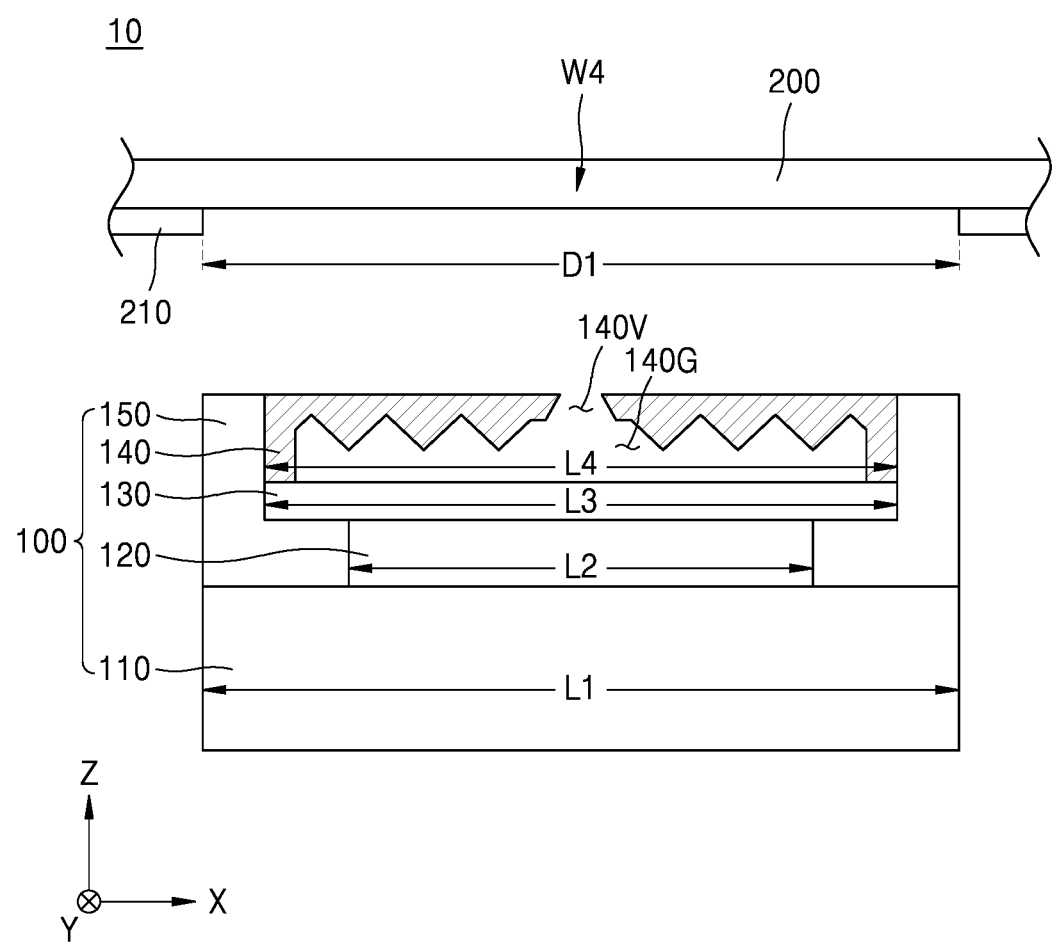
FIG. 1B is a cross-sectional view of an electronic device including an LED package according to exemplary embodiments.

FIG. 1A is a plan view of an electronic device 10 including a light-emitting diode (LED) package according to embodiments, and FIG. 1B is a partial cross-sectional view of the electronic device 10. In detail, FIG. 1B is a cross-sectional view of a portion corresponding to a fourth optical window W4 in FIG. 1A.

Referring to FIG. 1A, the electronic device 10 may be a cellular phone, e.g., a smartphone. However, the electronic device 10 may be any electronic device including an optical window for an optical device (e.g., an illumination, an optical sensor, a camera, and the like), such as a notebook computer, a desktop computer, a monitor, a tablet, or a digital camera.

As illustrated in FIG. 1A, the electronic device 10 may include a plurality of optical windows W1, W2, W3, W4, and W5. According to exemplary embodiments, the optical windows W1, W2, and W3 may provide optical paths for cameras having different functions. For example, the optical window W1 may provide an optical path for a super wide angle camera, the optical window W2 may provide an optical path for a wide angle camera, and the optical window W3 may provide an optical path for a telephoto camera. The optical window W4 may provide an optical path for an LED package 100, which is a light source of a flash illumination. The optical window W5 may provide an optical path for an ambient light sensor, e.g., an infrared (IR) sensor.

According to exemplary embodiments, the electronic device 10, in which a diameter D1 of the optical window W4 is reduced and which has a high central illuminance and super wide angle light alignment characteristics at the same time, may be provided. Accordingly, a user experience of high level may be provided, and at the same time, the reliability of the electronic device 10 may be improved.

Referring to FIG. 1B, the electronic device 10 may include the LED package 100 and a cover glass 200. The cover glass 200 may be provided on the LED package 100, e.g., to overlap a top of the LED package 100.

The LED package 100 may generate white light, but is not limited thereto. The LED package 100 may be, e.g., an illumination light source of a flash light. The LED package 100 may include a substrate 110, an LED chip 120, an adhesive phosphor film 130, a cell lens 140, and a lateral reflective layer 150.

The LED chip 120 may be mounted on the substrate 110. The substrate 110 may be, e.g., a printed circuit board. For example, the substrate 110 may include a metal and/or a metal compound. The substrate 110 may be, e.g., a metal-core printed circuit board (MCPCB), and may include, e.g., copper (Cu). In another example, the substrate 110 may be a flexible printed circuit board (FPCB) that is flexible and easily deformable to various shapes. In yet another example, the substrate 110 may be a FR4-type printed circuit board, and may include a resin material including, e.g., epoxy, triazine, silicon, and polyimide, or may include a ceramic material, e.g., silicon nitride, AlN, $Al_2O_3$, or the like.

Two directions that are parallel to an upper surface of the substrate 110 and perpendicular to each other are respectively defined as an X-direction and a Y-direction, and a direction perpendicular to the upper surface of the substrate 110 is defined as a Z-direction. According to exemplary embodiments, a planar shape of the substrate 110 may be a square. An X-direction length L1 of the substrate 110 may be in a range of about 1 mm to about 3 mm, e.g., the X-direction length L1 of the substrate 110 may be about 1.9 mm. A Y-direction length of the substrate 110 may be substantially equal to the X-direction length L1. A pair of edges of the substrate 110 may be parallel to the X-direction, and another pair of edges thereof may be parallel to the Y-direction. Also, planar shapes of the LED chip 120, the adhesive phosphor film 130, and the cell lens 140 which will be described later may be each a square. According to exemplary embodiments, each of the substrate 110, the adhesive phosphor film 130, and the cell lens 140 may include a pair of edges parallel to the X-direction and a pair of edges parallel to the Y-direction.

For example, the LED chip 120 may be mounted on the substrate 110 in a flip chip form. In this case, the LED package 100 may further include an external connection terminal, e.g., a solder or a bump, interposed between the substrate 110 and the LED chip 120. In another example, the LED chip 120 may be mounted on the substrate 110 in an epi-up form. In this case, the LED chip 120 may be electrically connected to the substrate 110 via a bonding wire, and the bonding wire may be molded by the lateral reflective layer 150.

According to exemplary embodiments, an X-direction length L2 of the LED chip 120 may be in a range of about 1 mm to about 2 mm, e.g., the X-direction length L2 of the LED chip 120 may be about 1.5 mm. For example, as illustrated in FIG. 1B, the X-direction length L2 of the LED chip 120 may be smaller than the X-direction length L1 of the substrate 110. A Y-direction length of the LED chip 120 may be substantially equal to the X-direction length L2. For example, as illustrated in FIG. 1B, the LED chip 120 may be centered on the substrate 110. The LED chip 120 may generate blue light, but is not limited thereto.

The LED chip 120 may include a first conductivity-type semiconductor layer, an active layer, and a second conductivity-type semiconductor layer. According to exemplary embodiments, the first conductivity-type semiconductor layer may include, e.g., a single-crystal nitride having a composition of $Al_xIn_yGa_{1-x-y}N$ ($0 \leq x \leq 1$, $0 \leq y \leq 1$, and $0 \leq x+y \leq 1$). The first conductivity-type semiconductor layer may include a semiconductor doped with an n-type impurity. According to exemplary embodiments, the first conductivity-type semiconductor layer may include GaN doped with Si or the like.

The active layer may be arranged on the first conductivity-type semiconductor layer. The active layer may emit light having certain energy via recombination of electrons and holes. According to exemplary embodiments, the active layer may include a multiple quantum well (MQW) structure in which quantum well layers and quantum barrier layers are alternately stacked. Thicknesses of the quantum well layers and the quantum barrier layers may be about 3 nm to about 10 nm. According to exemplary embodiments, the MQW structure may include a multiple stack structure of InGaN and GaN. However, embodiments are not limited thereto, e.g., the active layer may include a single quantum well (SQW) structure.

The second conductivity-type semiconductor layer may include a single-crystal nitride having a composition of $Al_xIn_yGa_{1-x-y}N$ ($0 \leq x \leq 1$, $0 \leq y \leq 1$, and $0 \leq x+y \leq 1$) doped with a p-type impurity. A p-type impurity may include, e.g., Mg, but is not limited thereto.

The adhesive phosphor film 130 may be arranged on the LED chip 120, e.g., the LED chip 120 may be between the adhesive phosphor film 130 and the substrate 110. The adhesive phosphor film 130 may be in, e.g., direct, contact with the LED chip 120. According to exemplary embodiments, the adhesive phosphor film 130 may be a film in which a phosphor material, e.g., fluorescent material, is mixed with a transparent resin, e.g., Si. According to exemplary embodiments, the adhesive phosphor film 130 may reduce a color distribution of light generated using the LED chip 120. According to exemplary embodiments, the adhesive phosphor film 130 may convert blue light generated by the LED chip 120 into white light, but is not limited thereto.

According to exemplary embodiments, an X-direction length L3 of the adhesive phosphor film 130 may be in a range of about 1 mm to about 2 mm. According to exemplary embodiments, the X-direction length L3 of the adhesive phosphor film 130 may be greater than the X-direction length L2 of the LED chip 120. According to exemplary embodiments, the x-direction length L3 of the adhesive phosphor film 130 may be less than twice the X-direction length L2 of the LED chip 120. According to exemplary embodiments, the X-direction length L3 of the adhesive phosphor film 130 may be about 1.6 mm. A Y-direction length of the adhesive phosphor film 130 may be substantially equal to the X-direction length L3.

The cell lens 140 may be provided on the adhesive phosphor film 130, e.g., the adhesive phosphor film 130 may be between the cell lens 140 and the LED chip 120. According to exemplary embodiments, the cell lens 140 may at least partially contact the adhesive phosphor film 130, e.g., the cell lens 140 may be in direct contact with edges of the adhesive phosphor film 130. According to exemplary embodiments, the cell lens 140 may be a Fresnel lens. A Fresnel lens is a flat lens used in light condensing or magnification, and may include a series of concentric grooves 140GR (see FIG. 2A) carved in a surface of a light-transmissive sheet, e.g., the grooves 140GR may be in a surface of the cell lens 140 that faces the adhesive phosphor film 130 (FIG. 1B). The grooves 140GR (see FIG. 2A) may be respectively regarded as different individual lenses, and the individual lenses may have an identical focal point. According to exemplary embodiments, the cell lens 140 may include at least one of a plastic material, e.g., acryl, polymethyl methacrylate (PMMA), polyvinylchloride (PVC), polycarbonate (PC), epoxy, and high-density polyethylene (HDPE), a glass material, e.g., fused silica, and a semiconductor material, e.g., silicon (Si), but is not limited thereto.

According to exemplary embodiments, an X-direction length L4 of the cell lens 140 may be in a range of about 1 mm to about 2 mm. According to exemplary embodiments, the X-direction length L4 of the cell lens 140 may be greater than the X-direction length L2 of the LED chip 120. According to exemplary embodiments, the X-direction length L4 of the cell lens 140 may be less than twice the X-direction length L2 of the LED chip 120. According to exemplary embodiments, the X-direction length L4 of the cell lens 140 may be substantially equal to the X-direction length L3 of the adhesive phosphor film 130. According to exemplary embodiments, the X-direction length L4 of the cell lens 140 may be about 1.6 mm. According to exemplary embodiments, a Y-direction length of the cell lens 140 may be substantially equal to the X-direction length L4.

Figure 2A:
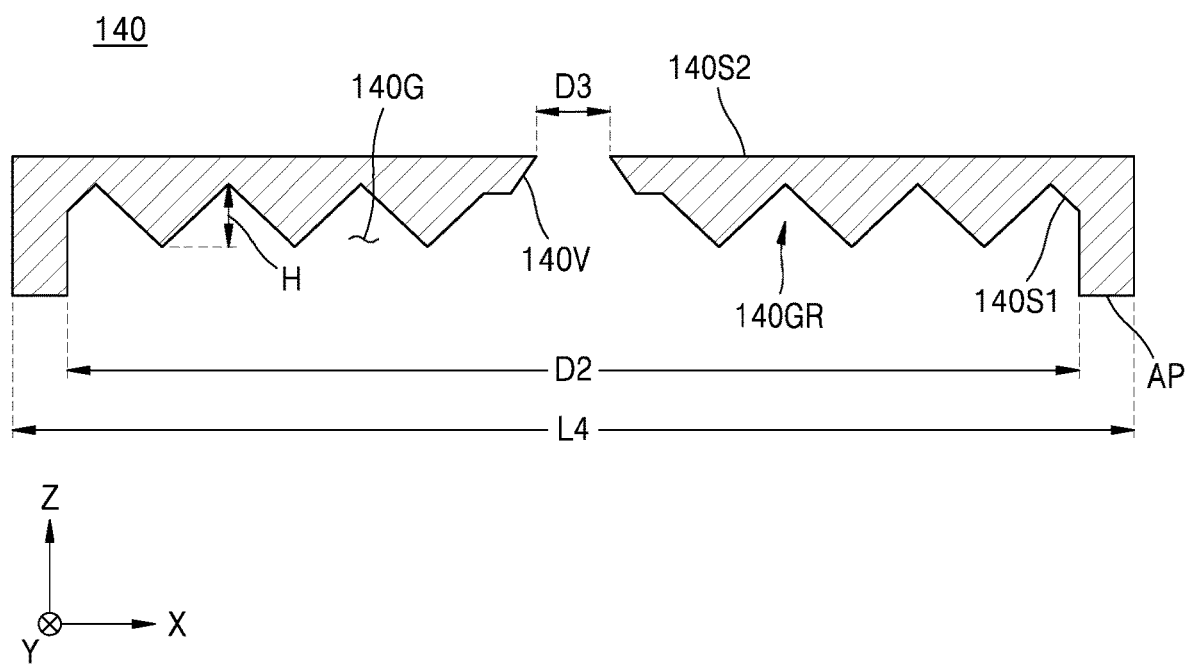
FIG. 2A is a cross-sectional view of a cell lens according to exemplary embodiments.
Figure 2B:
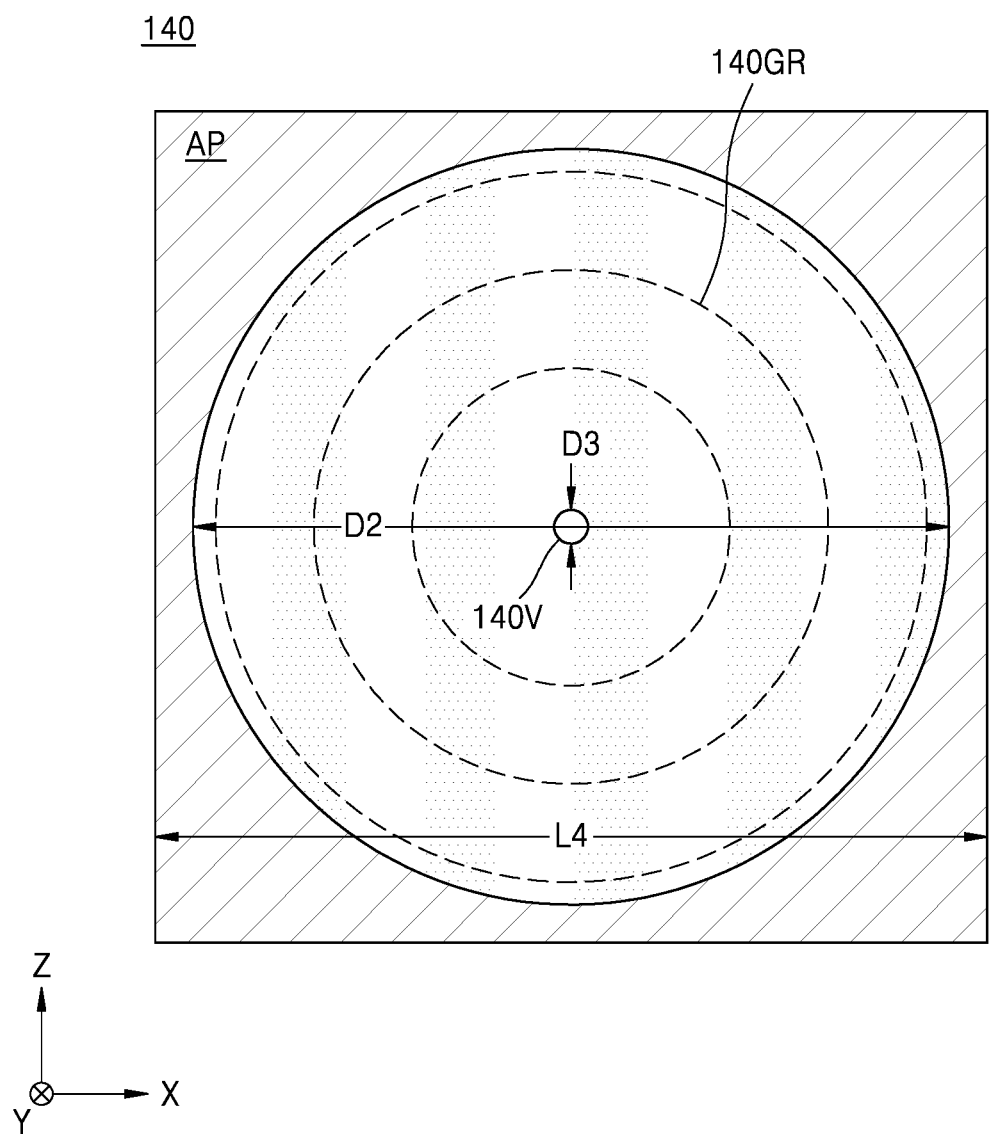
FIG. 2B is a plan view illustrating a cell lens according to exemplary embodiments.

A structure of the cell lens 140 will be described in further detail by referring to FIGS. 2A and 2B. FIG. 2A is a cross-sectional view of the cell lens 140 according to embodiments, and FIG. 2B is a plan view of a second surface 140S2 of the cell lens 140 (i.e., toward a first surface 140S1 of the cell lens 140). In FIG. 2B, from among the grooves 140GR in FIG. 2A, points that are closest to a second surface 140S2 (i.e., centers of the grooves 140GR) are marked with a dashed line.

Referring to FIGS. 1B through 2B, the cell lens 140 may include the first surface 140S1, in which the grooves 140GR are formed, and the second surface 140S2 that is opposite to the first surface 140S1 and is substantially flat. The first surface 140S1 may be a Fresnel lens surface facing the adhesive phosphor film 130. The cell lens 140 may include an adhesive portion AP that partially contacts an upper surface of the adhesive phosphor film 130, e.g., the adhesive portion AP may connect an outer edge of the cell lens 140 to an edge of the adhesive phosphor film 130. According to exemplary embodiments, the adhesive portion AP of the cell lens 140 may, e.g., continuously, extend along edges of the cell lens 140. For example, as illustrated in FIG. 2A, the top surface of the adhesive portion AP may be coplanar with the second surface 140S2 of the cell lens 140, and the adhesive portion AP may extend along the Z-direction from the second surface 140S2 toward the first surface 140S1 and beyond the first surface 140S1. The adhesive portion AP of the cell lens 140 may be spaced apart from the second surface 140S2 farther than protrusions between the grooves 140GR of the cell lens 140, e.g., the adhesive portion AP may extend along the Z-direction beyond the protrusions between the grooves 140GR. Accordingly, an air gap 140G may be formed between the first surface 140S1 and the adhesive phosphor film 130.

According to exemplary embodiments, the first surface 140S1 of the cell lens 140 may be rotationally symmetric to an axis that is parallel to the Y-direction and passes a center the first surface 140S1. According to exemplary embodiments, a diameter D2 of the cell lens 140 corresponding to the first surface 140S1, e.g., as measured along the X-direction between facing surfaces of the adhesive portion AP, may be, e.g., about 1.4 mm or less, but is not limited thereto. The diameter D2 of the cell lens 140 may equal a diameter D2 of the air gap 140G.

According to exemplary embodiments, light intensity according to an angle at which light generated by the LED package 100 is emitted through the optical window W4 of the electronic device 10 may vary depending on a profile of the first surface 140S1 having the plurality of grooves 140GR. The angle at which light is emitted through the optical window W4 refers to an angle with respect to a normal of the cover glass 200 constituting the optical window W4, i.e., with respect to the Y-direction. According to an embodiment, an intensity of light emitted from the optical window W4 of the electronic device 10 at nearly 0° may increase according to the profile of the first surface 140S1, and in this case, light generated by the LED package 100 may be transmitted to a projection surface that is away from the electronic device 10. According to another embodiment, an intensity of light emitted from the optical window W4 of the electronic device 10 at an angle in a range of about 30° to about 40° may be increased according to the profile of the first surface 140S1, and light generated using the LED package 100 may have super wide angle light distribution characteristics.

According to exemplary embodiments, a vent hole 140V may be formed in a center portion of the cell lens 140, e.g., the vent hole 140V may extend through an entire thickness of the cell lens 140. Accordingly, separation between the cell lens 140 and the adhesive phosphor film 130 during a manufacturing process of the LED package 100 may be prevented. For example, as illustrated in FIG. 2B, a planar shape of the vent hole 140V may be a circle, but is not limited thereto. For example, a planar shape of the vent hole 140V may be a quadrangle.

For example, as illustrated in FIG. 2A, the vent hole 140V of the cell lens 140 may have a diameter that decreases towards the second surface 140S2, e.g., the diameter of the vent hole 140V measured at the second surface 140S2 of the cell lens 140 may be smaller than the diameter of the vent hole 140V measured at the first surface 140S1 of the cell lens 140. According to exemplary embodiments, a diameter D3 of the vent hole 140V may be in a range of about 50 μm to about 100 μm as measured on a same plane as the second surface 140S2. According to exemplary embodiments, particles having a diameter of about 100 μm or less do not substantially degrade light-emitting characteristics of the LED package 100 when they are introduced into the air gap 140G via the vent hole 140V. According to exemplary embodiments, by providing the vent hole 140V having the diameter D3 of about 100 μm or less, separation between the cell lens 140 and the adhesive phosphor film 130 may be prevented, while light-emitting characteristics of the LED package 100 are not degraded, thereby improving the reliability of the LED package 100.

According to exemplary embodiments, a height H of the plurality of grooves 140GR may be in a range of about 35 μm to about 65 μm. For example, the height H of the plurality of grooves 140GR may be about 50 μm.

For example, as illustrated in FIG. 2B, three grooves 140GR that are circle-symmetric are formed outside the center portion of the cell lens 140, e.g., the grooves 140GR may be concentric around the center portion of the cell lens 140. However, embodiments are not limited thereto, e.g., the cell lens 140 may include one or two grooves as illustrated in FIGS. 3B and 4B, respectively, or four or more grooves.

Referring back to FIG. 1B, the lateral reflective layer 150 may cover the upper surface of the substrate 110, a lateral surface of the LED chip 120, a lateral surface of the adhesive phosphor film 130, and a lateral surface of the cell lens 140. The lateral reflective layer 150 may, e.g., directly, contact each of the upper surface of the substrate 110, the lateral surface of the LED chip 120, the lateral surface of the adhesive phosphor film 130, and the lateral surface of the cell lens 140. According to exemplary embodiments, the lateral reflective layer 150 may further cover a lower surface of the adhesive phosphor film 130. According to exemplary embodiments, the lateral reflective layer 150 may, e.g., directly, contact the lower surface of the adhesive phosphor film 130. According to exemplary embodiments, a lateral surface of the lateral reflective layer 150 (that is, a surface parallel to the Y-direction) may be coplanar with a lateral surface of the substrate 110 (that is, a surface parallel to the Y-direction). For example, as illustrated in FIG. 1B, an outer lateral surface of the lateral reflective layer 150 (i.e., a surface facing away from the cell lens 140) may be coplanar, e.g., aligned, with a lateral surface of the substrate 110. According to exemplary embodiments, an upper surface of the lateral reflective layer 150 may be coplanar with an upper surface of the cell lens 140, e.g., with the second surface 140S2 of the cell lens 140.

According to exemplary embodiments, the lateral reflective layer 150 may include a white resin. The white resin may be, e.g., a Si resin to which $TiO_2$ is added, but is not limited thereto. According to exemplary embodiments, the lateral reflective layer 150 may have a high reflectance, and accordingly, a light-emitting efficiency of the LED package 100 may be improved.

The cover glass 200 may be provided on the LED package 100. The cover glass 200 may include, e.g., a glass material such as fused silica, but is not limited thereto. A light-shielding portion 210 may be arranged on a surface of the cover glass 200 facing the LED package 100. The light-shielding portion 210 may define the optical window W4. According to exemplary embodiments, the optical window W4 may have the diameter D1 in a range of about 1 mm to about 3 mm. According to exemplary embodiments, the diameter D1 may be about 2 mm or less. According to exemplary embodiments, the diameter D1 may be about 1.6 mm or less.

According to exemplary embodiments, the Z-direction distance between the cover glass 200 and the upper surface of the cell lens 140 may be in a range of about 0.1 mm to about 0.3 mm. According to exemplary embodiments, the Z-direction distance between the cover glass 200 and the upper surface of the cell lens 140 may be about 0.2 mm.

Figure 3A:
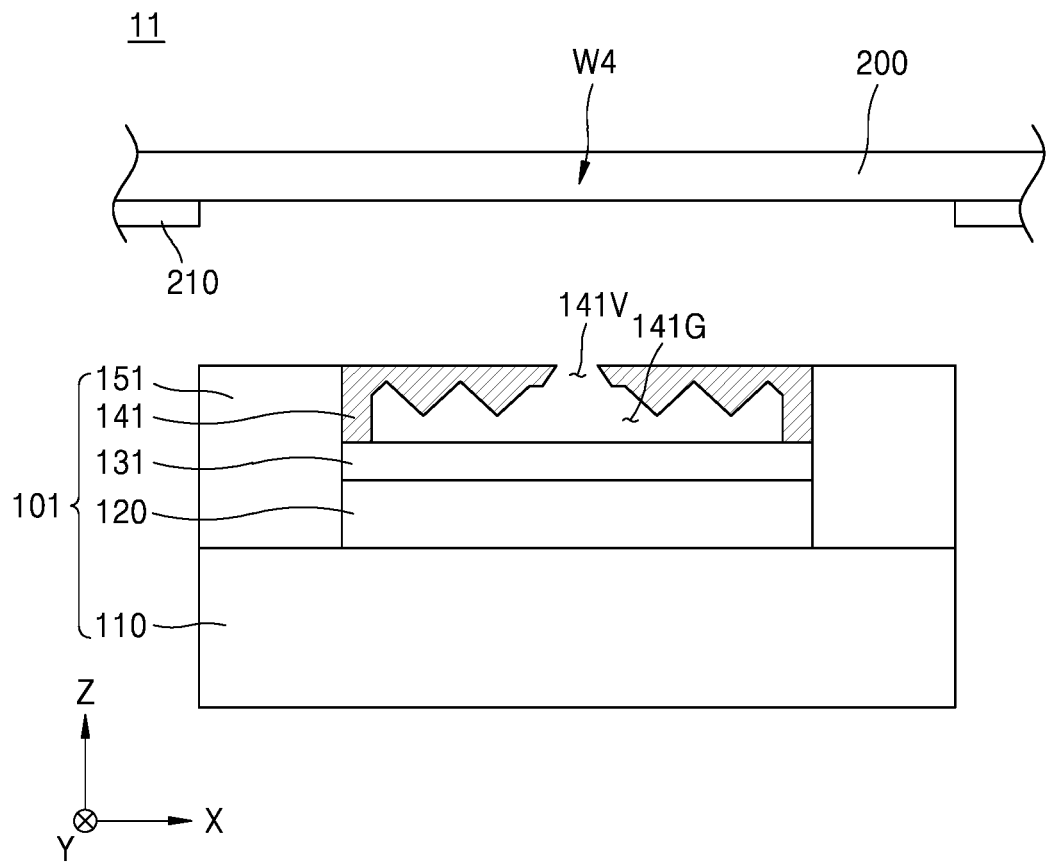
FIG. 3A is a cross-sectional view of an electronic device including an LED package according to exemplary embodiments.
Figure 3B:
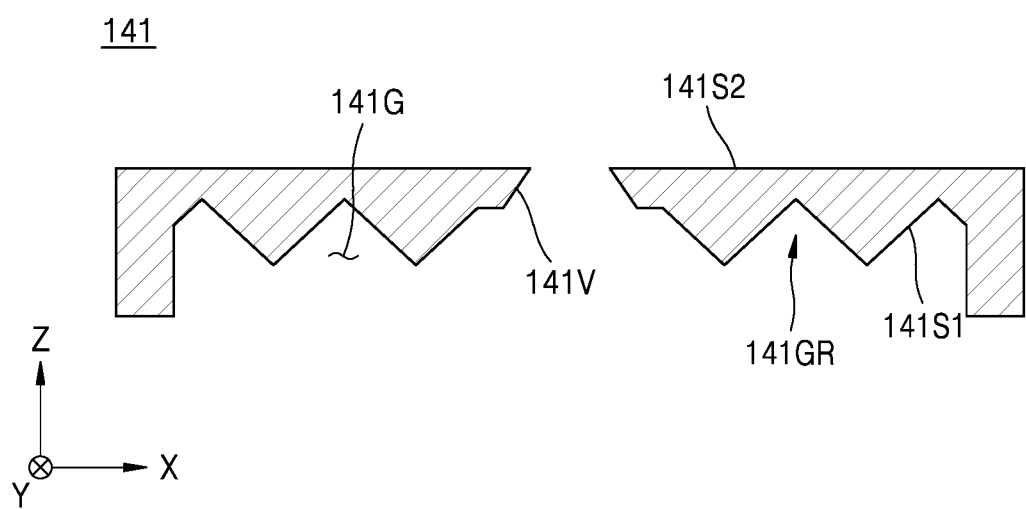
FIG. 3B is an enlarged cross-sectional view of a cell lens included in an LED package according to exemplary embodiments.

FIG. 3A is a cross-sectional of an electronic device 11 including an LED package 101 according to exemplary embodiments. FIG. 3B is an enlarged cross-sectional view of a cell lens 141 included in the LED package 101 according to exemplary embodiments. For convenience of description, the description will focus on the differences between the present embodiment and that described previously with reference to FIGS. 1A and 1B, and description of repeated details will be omitted.

Referring to FIGS. 3A and 3B, the electronic device 11 may be substantially the same as the electronic device 10 of FIG. 1B, except that the electronic device 11 includes the LED package 101 different from the LED package 100 of FIG. 1B. The LED package 101 may include the substrate 110, the LED chip 120, an adhesive phosphor film 131, a cell lens 141, and a lateral reflective layer 151. The substrate 110 and the LED chip 120 are substantially the same as those described with reference to FIG. 1B.

Unlike FIG. 1B, X-direction lengths of the adhesive phosphor film 131 and the cell lens 141 may be respectively substantially equal to an X-direction length of the LED chip 120, and Y-direction lengths of the adhesive phosphor film 131 and the cell lens 141 may be respectively substantially equal to a Y-direction length of the LED chip 120. Accordingly, respective lateral surfaces of the LED chip 120, the adhesive phosphor film 131, and the cell lens 141 may be coplanar with each other. The lateral reflective layer 151 may cover the respective lateral surfaces of the LED chip 120, the adhesive phosphor film 131, and the cell lens 141.

According to exemplary embodiments, a first surface 141S1 of the cell lens 141 may face the adhesive phosphor film 131, and a second surface 141S2 of the cell lens 141 may be opposite to the first surface 141S1. According to exemplary embodiments, an air gap 141G may be formed between the first surface 141S1 and the adhesive phosphor film 131, and a vent hole 141V communicating with the air gap 141G may be formed in a center portion of the cell lens 141. According to exemplary embodiments, the number of grooves 141GR formed in the first surface 141S1 may be less than that of FIG. 2B, but is not limited thereto.

Figure 4A:
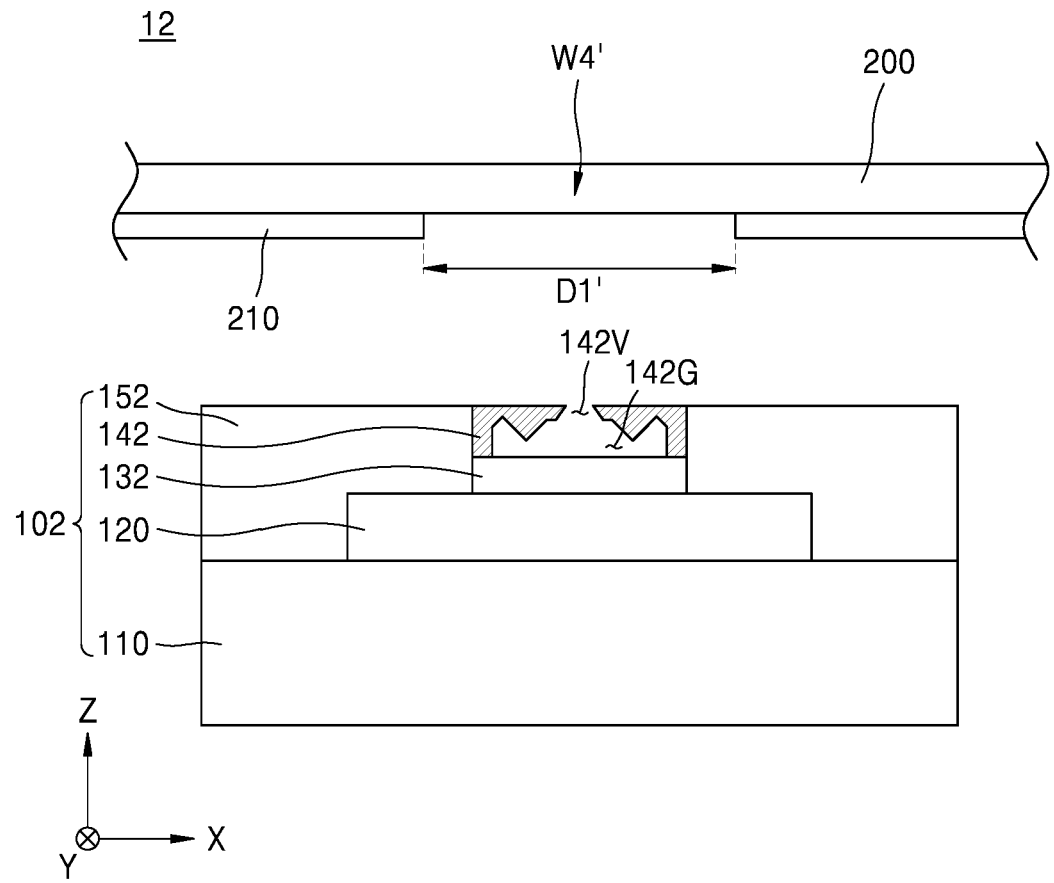
FIG. 4A is a cross-sectional view of an electronic device including an LED package according to exemplary embodiments.
Figure 4B:
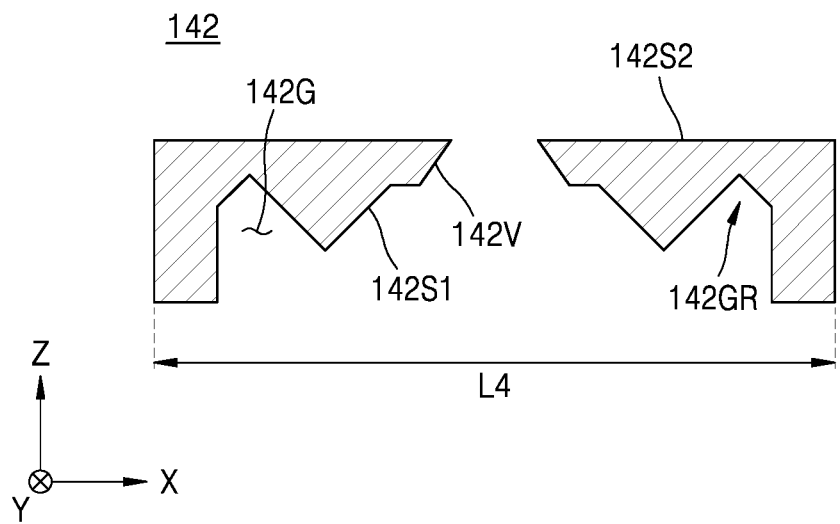
FIG. 4B is an enlarged cross-sectional view of a cell lens included in an LED package according to exemplary embodiments.

FIG. 4A is a cross-sectional view of an electronic device 12 including an LED package 102 according to exemplary embodiments. FIG. 4B is an enlarged cross-sectional view of a cell lens 142 included in the LED package 102 according to exemplary embodiments. For convenience of description, the description will focus on the differences between the present embodiment and that described previously with reference to FIGS. 1A and 1B, and description of repeated details will be omitted.

Referring to FIGS. 4A and 4B, the electronic device 12 may be substantially the same as the electronic device 10 of FIG. 1B, except that the electronic device 12 includes the LED package 102 that is different from the LED package 100 of FIG. 1B. The LED package 102 may include the substrate 110, the LED chip 120, an adhesive phosphor film 132, a cell lens 142, and a lateral reflective layer 152. The substrate 110 and the LED chip 120 are substantially the same as those described with reference to FIG. 1B.

Unlike FIG. 1B, X-direction lengths of the adhesive phosphor film 132 and the cell lens 142 may be respectively less than an X-direction length of the LED chip 120, and Y-direction lengths of the adhesive phosphor film 132 and the cell lens 142 may be respectively less than a Y-direction length of the LED chip 120. The X-direction lengths of the adhesive phosphor film 132 and the cell lens 142 may be respectively equal to or greater than a half of the X-direction length of the LED chip 120, and the Y-direction lengths of the adhesive phosphor film 132 and the cell lens 142 may be respectively equal to or greater than a half of the Y-direction length of the LED chip 120.

Accordingly, the lateral reflective layer 152 may further cover an upper surface of the LED chip 120 in addition to respective lateral surfaces of the LED chip 120, the adhesive phosphor film 132, and the cell lens 142. According to exemplary embodiments, an intensity of light emitted from the LED package 102 at an angle of 0° may be increased. Accordingly, a range of reach of light generated using the electronic device 12 may be increased. Also, a size of the cell lens 142 (e.g., X-direction and Y-direction lengths) is reduced, and accordingly, a diameter D1' of an optical window W4' may be further reduced. Accordingly, a high level of user experience may be provided using the electronic device 12.

According to exemplary embodiments, a first surface 142S1 of the cell lens 142 may face the adhesive phosphor film 132, and a second surface 142S2 of the cell lens 142 may be opposite to the first surface 142S1. According to exemplary embodiments, an air gap 142G may be formed between the first surface 142S1 and the adhesive phosphor film 131, and a vent hole 142V communicating with the air gap 142G may be formed in a center portion of the cell lens 142. According to exemplary embodiments, the number of grooves 142GR formed in the first surface 142S1 may be less than that of FIG. 2B, but is not limited thereto. According to exemplary embodiments, a diameter D2 of the air gap 142G may be equal to or greater than about 0.5 mm, but is not limited thereto.

Figure 5:
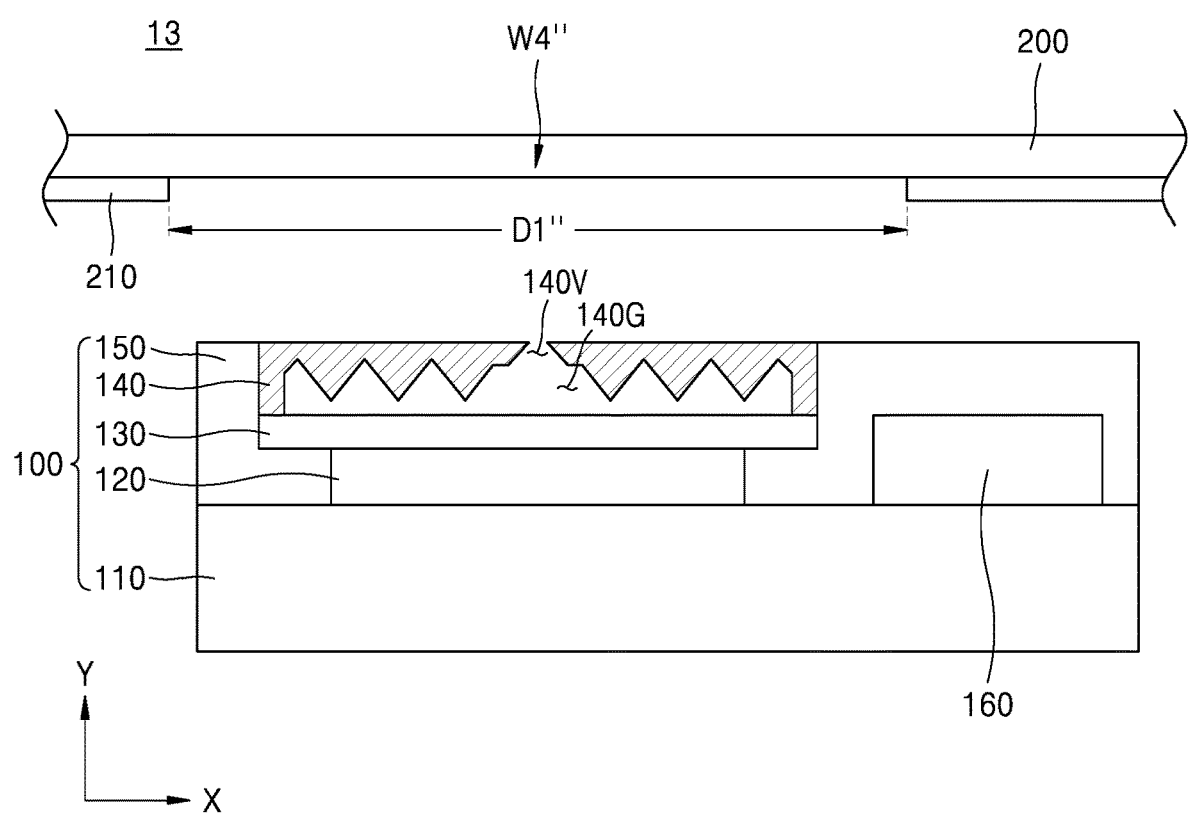
FIG. 5 is a cross-sectional view of an electronic device according to exemplary embodiments.

FIG. 5 is a cross-sectional view for describing an electronic device 13 according to embodiments. For convenience of description, description will focus on the differences between the present embodiments and that described previously with reference to FIGS. 1A and 1B, and description of repeated details will be omitted.

Referring to FIG. 5, the electronic device 13 may be substantially the same as the electronic device 10 of FIG. 1B, except that the electronic device 13 further includes an ambient light sensor 160 arranged adjacent to the LED chip 120.

In detail, according to exemplary embodiments, an LED package 103 has super wide angle light distribution characteristics, and thus only a portion of an optical window W4" may be used. Accordingly, light generated by the LED package 103 may be emitted using the single optical window W4" having a similar level of diameter to that of the related art (e.g., a diameter of about 3 mm), and also, ambient light may be sensed using the ambient light sensor 160. Accordingly, as the number of optical windows in a cover glass is reduced, a high level of user experience may be provided.

Figure 6:
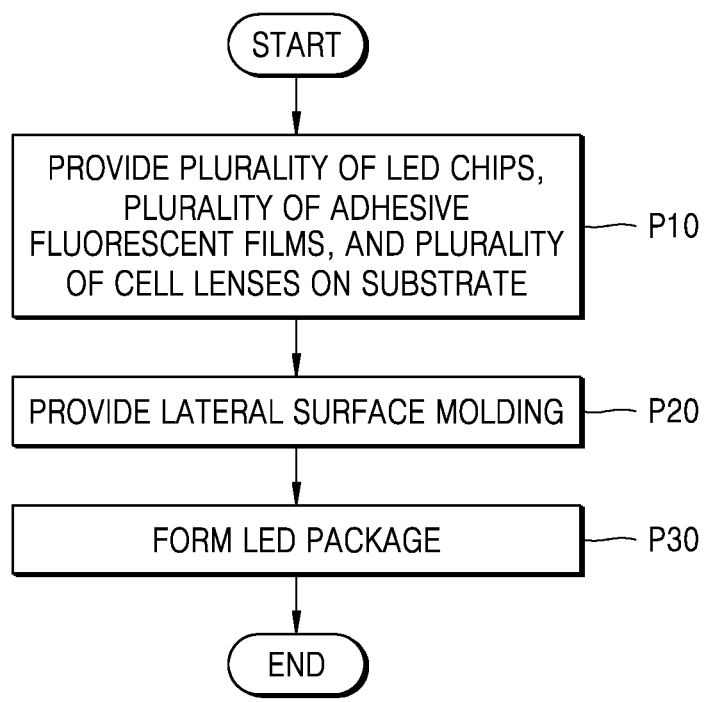
FIG. 6 is a flowchart of a method of manufacturing an LED package, according to exemplary embodiments.
Figure 7:
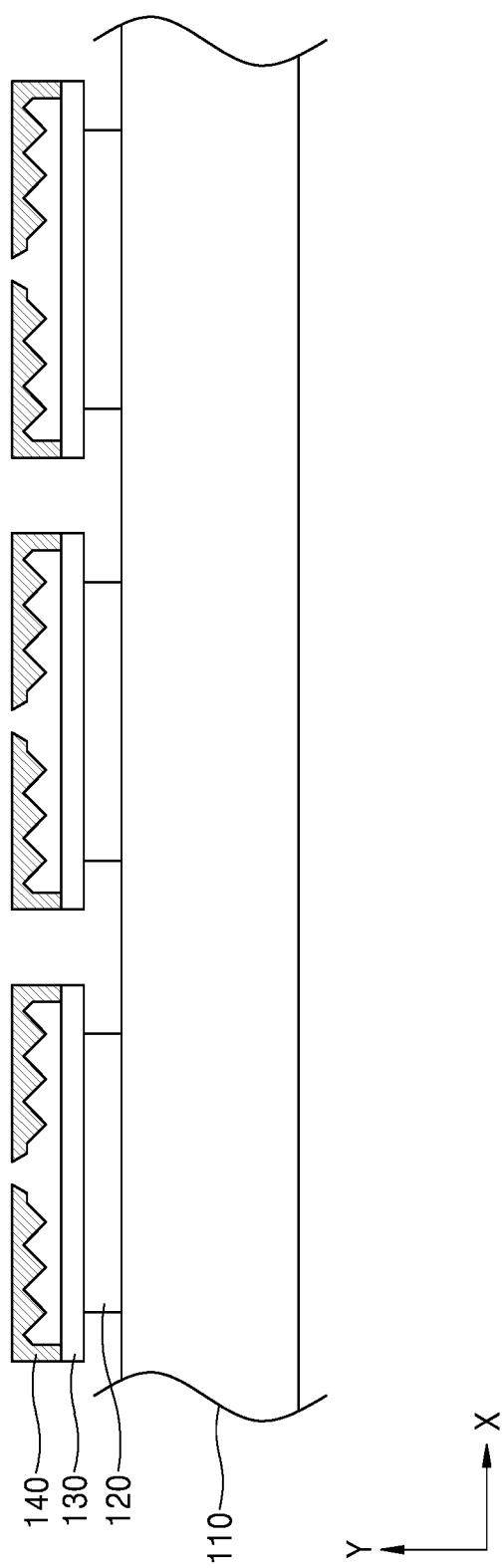
FIGS. 7 through 9 are cross-sectional views of stages in a method of manufacturing an LED package, according to exemplary embodiments.
Figure 8:
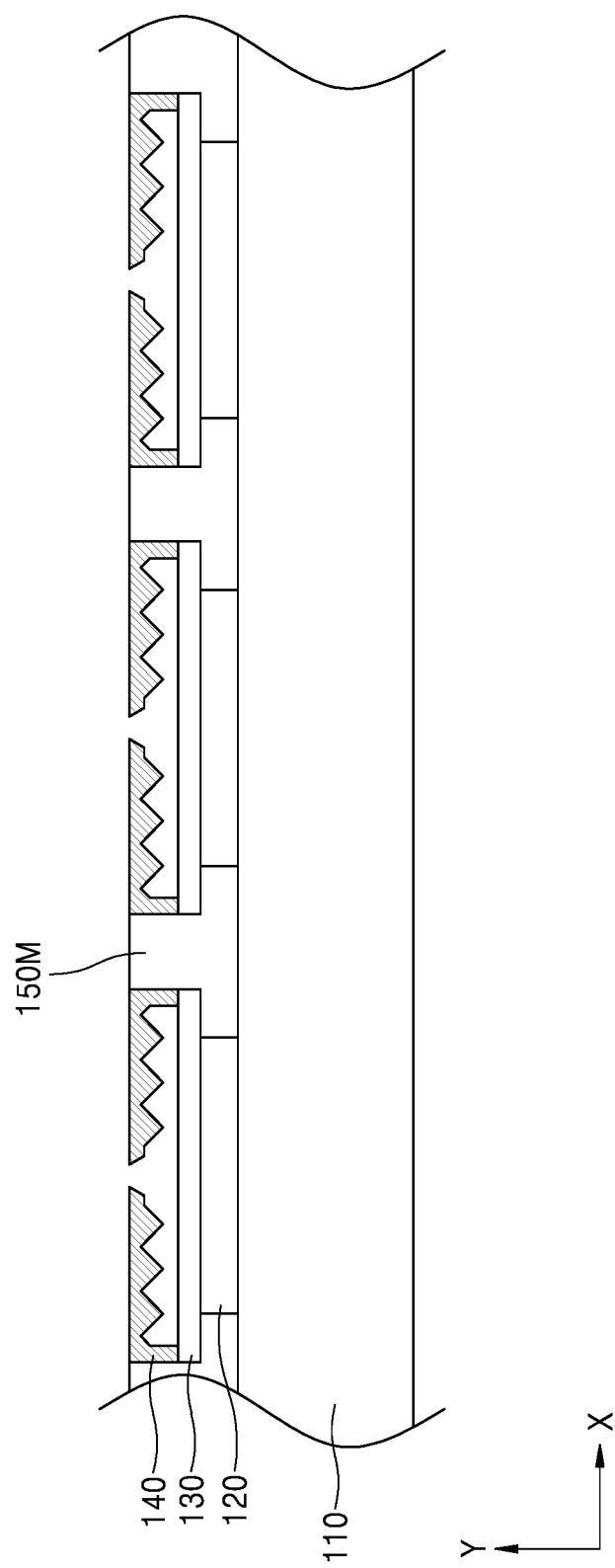
Figure 9:
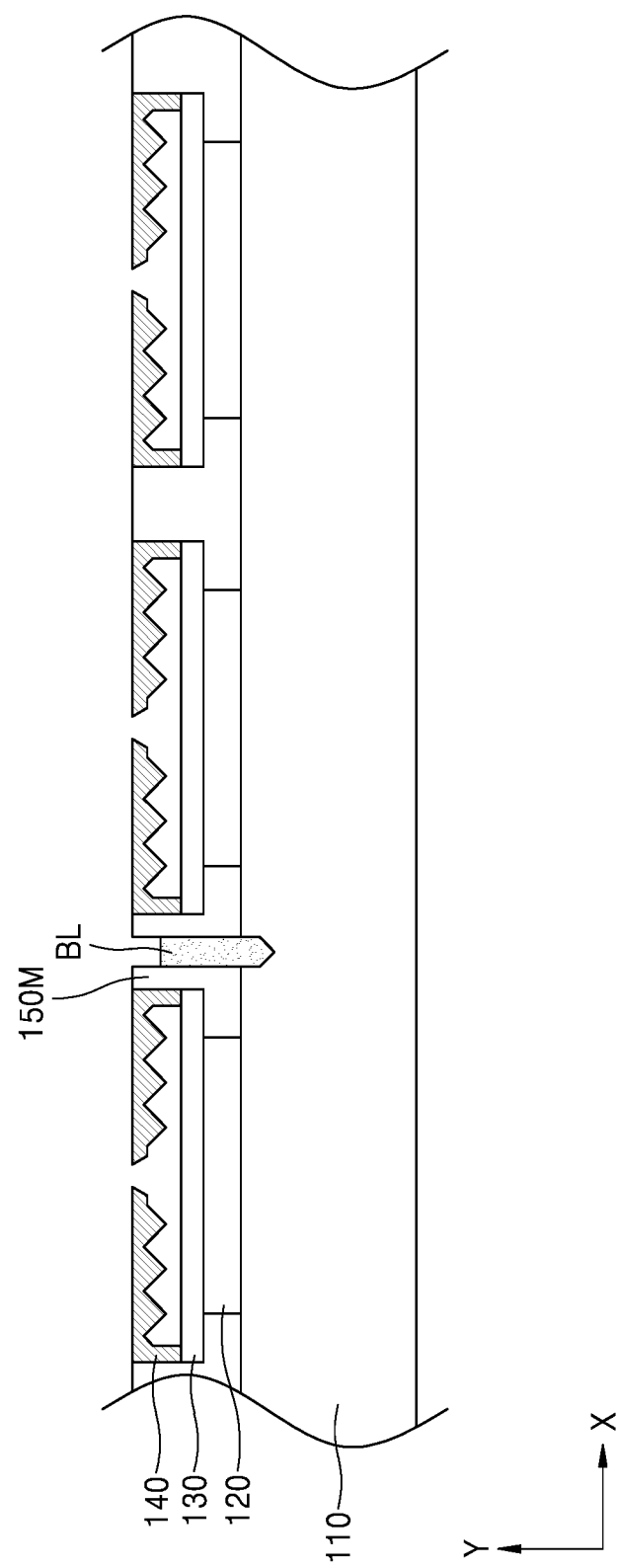

FIG. 6 is a flowchart of a method of manufacturing an LED package, according to exemplary embodiments. FIGS. 7 through 9 are cross-sectional views of stages in a method of manufacturing an LED package, according to exemplary embodiments.

Referring to FIGS. 6 and 7, in P10, a plurality of LED chips 120, a plurality of adhesive phosphor films 130, and a plurality of cell lenses 140 may be provided on the substrate 110.

According to exemplary embodiments, the plurality of LED chips 120 may be electrically connected to the substrate 110 via one of a solder and wire bonding. Next, the plurality of adhesive phosphor films 130 are bonded on the LED chips 120, and then the plurality of cell lenses 140 may be bonded on the plurality of adhesive phosphor films 130, e.g., in a one-to-one relationship.

Referring to FIGS. 6 and 8, in P20, a lateral molding 150M covering an upper surface of the substrate 110 and respective lateral surfaces of the plurality of LED chips 120, the plurality of adhesive phosphor films 130, and the plurality of cell lenses 140 may be provided and hardened. According to exemplary embodiments, the lateral molding 150M may include a same material as the lateral reflective layer 150, and an upper surface of the lateral reflective layer 150 may be at a same level as respective upper surfaces of the cell lenses 140.

The lateral molding 150M may be cured by, e.g., a thermal curing process. According to exemplary embodiments, each of the cell lenses 140 includes the vent hole 140V (see FIG. 1B), and thus, separation between the cell lenses 140 and the adhesive phosphor films 130 due to expansion of an air gap during a thermal hardening process may be prevented.

Referring to FIGS. 6, 9, and 1B, in P30, a plurality of LED packages 100 may be formed. Forming of the plurality of LED packages 100 may include cutting the lateral molding 150M between the plurality of LED chips 120 and the substrate 110 by using a blade BL. However, embodiments are not limited thereto, e.g., the lateral molding 150M between the plurality of LED chips 120 and the substrate 110 may be cut using laser.

By way of summation and review, when using an LED package as an illuminating light source of a flash light, a brightness, an optical beam angle, an entrance angle, or the like of the LED package need to be adjusted according to the product specifications. Recently, the demand for minimized diameters of holes formed in front and rear surfaces of a handset product has increases in order to provide high level of user experience. Accordingly, research into flash illumination light sources having super wide angle light distribution characteristics is needed.

Embodiment provide an LED package having improved light distribution characteristics and an electronic device including the LED package. That is, according to embodiments, the LED package includes an LED chip on a flat substrate, a phosphor resin film attached to the LED chip, a cell lens film that is a Fresnel lens, and a white resin covering the entire side of the Fresnel lens. By covering the entire structure as well as the cell lens with the white resin, it is possible to maximize the light incidence efficiency for the cell lens while reducing the size of the cell lens, and to implement ultra-wide-angle flash white light through a small optical window of a mobile phone. A vent hole connected to the air gap layer may be added in the center of the cell lens.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A light-emitting diode (LED) package, comprising:
a substrate;
an LED chip on the substrate;
an adhesive phosphor film on the LED chip;
a cell lens on the adhesive phosphor film; and
a lateral reflective layer covering respective lateral surfaces of the LED chip, the adhesive phosphor film, and the cell lens, a lateral surface of the lateral reflective layer being coplanar with a lateral surface of the substrate.

2. The LED package as claimed in claim 1, wherein the adhesive phosphor film contacts the LED chip, and the cell lens partially contacts an upper surface of the adhesive phosphor film.

3. The LED package as claimed in claim 1, wherein the lateral reflective layer includes a white resin.

4. The LED package as claimed in claim 1, wherein the lateral reflective layer includes Si and $TiO_2$.

5. The LED package as claimed in claim 1, wherein the lateral reflective layer contacts a lower surface of the adhesive phosphor film.

6. The LED package as claimed in claim 1, wherein the respective lateral surfaces of the LED chip, the adhesive phosphor film, and the cell lens are coplanar with each other.

7. The LED package as claimed in claim 1, wherein the lateral reflective layer contacts an upper surface of the LED chip.

8. The LED package as claimed in claim 1, further comprising an air gap between the cell lens and the adhesive phosphor film.

9. The LED package as claimed in claim 1, wherein an upper surface of the lateral reflective layer is coplanar with an upper surface of the cell lens.

10. A light-emitting diode (LED) package, comprising:
    a substrate;
    an LED chip electrically connected to the substrate;
    an adhesive phosphor film contacting an upper surface of the LED chip;
    a cell lens partially contacting an upper surface of the adhesive phosphor film, the cell lens including a Fresnel lens;
    an air gap between the cell lens and the adhesive phosphor film; and
    a lateral reflective layer covering respective lateral surfaces of the LED chip, the adhesive phosphor film, and the cell lens.

11. The LED package as claimed in claim 10, wherein the cell lens further includes an adhesive portion contacting the adhesive phosphor film, the air gap being surrounded by the adhesive portion.

12. The LED package as claimed in claim 10, wherein the cell lens includes:
    a first surface facing the adhesive phosphor film; and
    a second surface opposite to the first surface, the first surface including grooves recessed toward the second surface.

13. The LED package as claimed in claim 12, wherein the grooves are concentric with respect to a first direction perpendicular to the substrate.

14. The LED package as claimed in claim 12, wherein a height of the grooves is in a range of 35 μm to 65 μm.

15. The LED package as claimed in claim 10, wherein the cell lens further includes a vent hole in fluid communication with the air gap, the vent hole being in a center of the cell lens.

16. The LED package as claimed in claim 15, wherein the vent hole has a planar shape of a circle.

17. The LED package as claimed in claim 16, wherein a diameter of the vent hole is in a range of 50 μm to 100 μm.

18. An electronic device, comprising:
    a cover glass including an optical window; and
    a light-emitting diode (LED) package configured to emit light through the optical window, the LED package including:
    a substrate,
    an LED chip electrically connected to the substrate;
    an adhesive phosphor film contacting an upper surface of the LED chip;
    a cell lens partially contacting an upper surface of the adhesive phosphor film, the cell lens including a vent hole in a center of the cell lens, the vent hole having a diameter of 50 μm to 100 μm;
    an air gap between the cell lens and the adhesive phosphor film, the air gap being in fluid communication with the vent hole, and a diameter of the air gap being in a range of 0.5 mm to 1.4 mm; and
    a lateral reflective layer covering respective lateral surfaces of the LED chip, the adhesive phosphor film, and the cell lens.

19. The electronic device as claimed in claim 18, wherein a diameter of the optical window is equal to or less than 2 mm.

20. The electronic device as claimed in claim 18, further comprising an ambient light sensor electrically connected to the substrate, the ambient light sensor being adjacent to the LED chip, and the ambient light sensor configured to sense ambient light around the electronic device through the optical window.

* * * * *